(12) United States Patent
Kerber

(10) Patent No.: US 7,652,493 B2
(45) Date of Patent: Jan. 26, 2010

(54) TEST ARRANGEMENT HAVING CHIPS OF A FIRST SUBSTRATE ON A SECOND SUBSTRATE AND CHIPS OF THE SECOND SUBSTRATE ON A THIRD SUBSTRATE

(75) Inventor: Martin Kerber, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/152,925

(22) Filed: May 19, 2008

(65) Prior Publication Data

US 2008/0217615 A1    Sep. 11, 2008

Related U.S. Application Data

(62) Division of application No. 11/144,392, filed on Jun. 3, 2005.

(30) Foreign Application Priority Data

Jun. 4, 2004    (DE) .................... 10 2004 027 489

(51) Int. Cl.
*G01R 31/02* (2006.01)
(52) U.S. Cl. .................... 324/754; 324/158.1
(58) Field of Classification Search .................. None
See application file for complete search history.

(56) References Cited

U.S. PATENT DOCUMENTS

| | | |
|---|---|---|
| 4,021,276 A | 5/1977 | Cho et al. |
| 4,510,673 A | 4/1985 | Shils et al. |
| 4,941,255 A | 7/1990 | Bull |
| 6,020,750 A * | 2/2000 | Berger et al. ............ 324/755 |
| 6,173,750 B1 | 1/2001 | Davis et al. |
| 6,210,983 B1 | 4/2001 | Atchison et al. |
| 6,216,055 B1 | 4/2001 | Balamurugan et al. |
| 6,278,193 B1 | 8/2001 | Coico et al. |
| 6,479,305 B2 | 11/2002 | Kono et al. ............ 438/14 |
| 6,547,902 B2 | 4/2003 | Arai et al. |
| 6,576,923 B2 | 6/2003 | Satya et al. |
| 6,927,083 B2 | 8/2005 | Kline |

(Continued)

FOREIGN PATENT DOCUMENTS

DE    102 19 346 A1    11/2003

(Continued)

OTHER PUBLICATIONS

Office Action issued in counterpart Japanese application No. 2005-164851, dated Jul. 25, 2008, and English translation thereof, 4 pages.

(Continued)

*Primary Examiner*—Minh N Tang
(74) *Attorney, Agent, or Firm*—Brinks Hofer Gilson & Lione

(57) ABSTRACT

The invention relates to a method for arranging chips of a first substrate on a second substrate, in which the chips are grouped at least into first chips and into second chips, the first chips of the first substrate are singulated and the singulated first chips are arranged on the second substrate in such a way that each of the first chips on the second substrate is unambiguously assigned to the associated first chip on the first substrate.

9 Claims, 2 Drawing Sheets

U.S. PATENT DOCUMENTS

Figure 1:
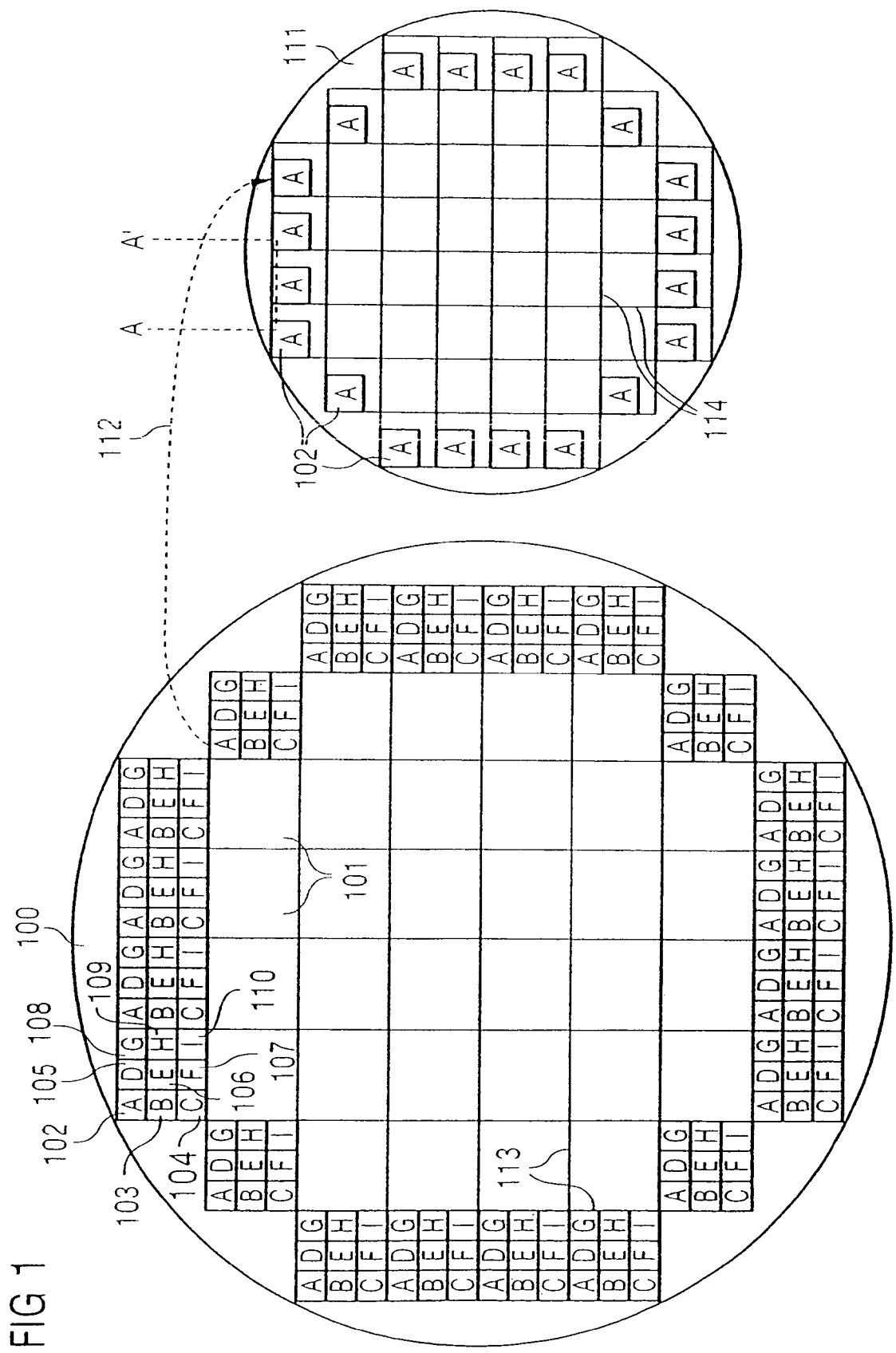

| | | |
|---|---|---|
| 2001/0040298 A1 | 11/2001 | Baba et al. |
| 2002/0017708 A1 | 2/2002 | Takagi et al. |
| 2004/0082111 A1 | 4/2004 | Yamauchi |
| 2004/0185580 A1 | 9/2004 | Goh |
| 2005/0032333 A1 | 2/2005 | Turner et al. |

FOREIGN PATENT DOCUMENTS

| | | |
|---|---|---|
| EP | 1 150 552 A2 | 10/2001 |
| EP | 2003-501827 | 1/2003 |
| JP | 11307618 | 11/1999 |
| JP | 2000-100882 A | 4/2000 |
| JP | 2003-501827 | 1/2003 |
| JP | 2003078069 A | 3/2003 |
| JP | 2003-248031 A | 5/2003 |
| JP | 2004115044 A | 4/2004 |
| WO | WO 00/75968 A1 | 12/2000 |

OTHER PUBLICATIONS

Examination report issued in German counterpart application No. 10 2004 027 489.4-33, Feb. 21, 2008, 3 pages in German.

* cited by examiner

TEST ARRANGEMENT HAVING CHIPS OF A FIRST SUBSTRATE ON A SECOND SUBSTRATE AND CHIPS OF THE SECOND SUBSTRATE ON A THIRD SUBSTRATE

RELATED APPLICATIONS

The present application is a division of application Ser. No. 11/144,392, filed Jun. 3, 2005, pending, which claims priority of German application no. 10 2004 027 489.4-33, filed Jun. 4, 2004, all of which are hereby incorporated herein in their entirety by this reference.

The invention relates to a method for arranging chips of a first substrate on a second substrate.

The current development in semiconductor technology is being concentrated increasingly on the processing of silicon wafers having a diameter of 300 mm. For cost reasons, developments in this technology generation are increasingly being carried out in development cooperations between a plurality of development partners.

In view of the rising quality requirements made of semiconductor products, it is necessary to monitor the functionality of a semiconductor product during and after a production process. For this purpose, test structures may be provided on a wafer, which usually has a multiplicity of electronic chips, a production process for forming integrated semiconductor circuits being monitored by means of said test structures. The extent or the number of available test structures increases as the wafer area increases, so that, in the transition from the 200 mm technology generation to the 300 mm technology generation, the number of test structures required for ensuring a good quality of semiconductor products produced also rises, to be precise in particular at least proportionally to the wafer area. Such PCM measurements (process control monitoring) involve checking, for example, whether the threshold voltage of transistors formed has an acceptable value, whether the nonreactive resistance of interconnects formed has an acceptable value, etc.

The high costs of a wafer require a comprehensive evaluation which, in the case of electrical measurements at the wafer level, can essentially only be effected sequentially, i.e. one after the other. The measurement time required for evaluating or monitoring the quality of a wafer likewise rises with the number of test structures.

In a development alliance of a plurality of semiconductor development partners for jointly developing a semiconductor product, the individual development partners in each case contribute their own blocks of test structures, which are often evaluated by development partner-specific employees in development partner-specific laboratories. On a wafer allocated to one development partner, the test structures of the other development partners often remain largely unused. At the very least the further utilization by other development partners is delayed.

The simultaneous utilization of different sub-chips of a wafer or of different test structures is possible if the structures are sawn and subsequently incorporated into individual housings in order subsequently to be examined there. This procedure is usually used for long-term examinations.

However, only a limited number of contacts can be bonded in this procedure. A subsequent alteration is not possible. Moreover, the configuration of such contacts has to be defined at an early point in time. The sequential examination of very many test structures is very complicated since housing costs and processing costs have to be taken into account for each test structure. In addition, considerable area on the wafer is lost due to a correspondingly large number of sawing lines.

To put it another way, when a chip with test structures is incorporated into a housing, it is necessary to define, as early as upon incorporation, which of the chip contacts (or which small number of chip contacts from a substantially larger number of possible chip contacts) of the chip in the housing is intended to be externally contact-connectable. As a result, the chip contacts that can be examined later are highly circumscribed in an undesirable manner at a point in time at which it is often not yet foreseeable what circumscription of contacts to be contact-connected is expedient.

U.S. Pat. No. 4,510,673 discloses a laser written chip identification method, the identification data being machine and human readable. In the method, chips are tested on a wafer and classified into "good", "poor" or "partially usable" and corresponding identification and test data are written to the individual chips. The chips are subsequently singulated and arranged on chip holders.

JP 11307618 A discloses a fixing device for chips with depressions which have inclined walls and a suction hole in the center, so that chip electrodes can be bonded precisely.

EP 1150552 A2 discloses chiplike electronic components, a pseudowafer therefor and corresponding production methods, with a wafer with bare chips that are cut from the semiconductor wafer.

JP 2003078069 A discloses a silicon pseudowafer for a multichip module production, a warpage of the pseudowafer being avoided by orienting the pseudowafer on the rear side of a resin layer.

JP 2004115044 A discloses a compartment for receiving bare chips, the compartment being arranged in a strip-type structure, and comprising a depression with a suction hole.

U.S. Pat. No. 4,021,276 discloses a method of making a rib-structure shadow mask for ion implantation, depressions being etched into a wafer surface by means of potassium hydroxide.

US 2002/0017708 A1 discloses a method for producing small quantities of semiconductor products in a production line for mass production, in which a chip identification code has coordinates of the respective chips.

DE 102 19 346 A1 discloses a method for mapping properties of a plurality of functional chips arranged on a wafer, properties of the functional chips being stored in a mapping table, and a plurality of reference chips being defined on the wafer in order to enable an assignment of the stored properties to the individual functional chips.

The invention is based on the problem of enabling the simultaneous examination of different chips of a substrate with increased economy.

The problem is solved by means of a method for arranging chips on a first substrate on a second substrate having the features in accordance with the independent patent claim.

In the method according to the invention for arranging chips of a first substrate on a second substrate, the chips are grouped at least into first chips and into second chips, the first chips of the first substrate are singulated, the singulated first chips are arranged on the second substrate in such a way that each of the first chips on the second substrate is unambiguously assigned to the associated first chip on the first substrate.

A basic idea of the invention can be seen in the realization of a (preferably congruent) transfer of chips of a first substrate (e.g. a 300 mm semiconductor wafer) onto a second substrate (e.g. a favorable carrier wafer having a smaller diameter), in particular for a more effective electronic analysis of the first chips. The transfer is effected in such a way that, for each first chip on the second substrate, an unambiguous assignment to the position of said first chip on the first substrate is made possible. To put it another way, for each first chip on the second substrate it is possible to unambiguously determine that location of the first substrate at which said chip was arranged on the first substrate prior to the singulation of the chips of the first substrate.

Clearly, different chips (e.g. first chips, second chips, third chips, . . . ) which may be assigned to different development partners of a development cooperation (e.g. the first chips may be assigned to a first development partner, the second chips to a second development partner, the third chips to a third development partner, . . . ) are firstly singulated from a first substrate. Singulation is to be understood to mean a method by which the individual chips on the first substrate can be physically separated from one another, for example by means of sawing and/or breaking the first substrate, preferably along previously defined sawing lines or desired breaking lines. A combination of sawing-out and rear-side material removal of the first substrate (e.g. by means of etching) for singulation is also possible.

The first chips of the first substrate are then arranged on the second substrate in accordance with a specific geometrical distribution. This arrangement, i.e. clearly a pixel mapping of the first chips on the first substrate, is mapped onto a second substrate, so that clearly each first chip on the first substrate may assume a corresponding geometrical position as later on the second substrate. As an alternative, the first chips on the second wafer may also be assigned to their earlier position on the first wafer in a different manner, e.g. by means of a marking or by current chip positions on the second substrate being unambiguously assigned to former chip positions on the first substrate in a table or database. Such a table may be stored for example in an external memory of a computer or may be stored on a memory device on the second chip.

In other words, an unambiguous geometrical assignment between the localization (i.e. the location of the arrangement) of the first chips on the first substrate and the localization of the first chips on the second substrate is preferably performed, so that each first chip on the second substrate can be assigned to the associated first chip on the first substrate in a simple manner.

The possibility of unambiguously assigning a respective first chip on the second substrate to its former geometrical position on the first substrate is advantageous particularly when the first chips on the second substrate are subjected to a test measurement. If, by way of example, the intention is to determine the thickness of a gate insulating layer of a test field effect transistor of a first chip on the second substrate in order to check the quality of a process for producing the test field effect transistor of the first chip on the first substrate, then said thickness may vary across the first substrate in a manner dictated by the process. Therefore, a position-specific assignment is advantageous by means of which, for the first chip on the second substrate, it is possible to determine that position on the first substrate at which the test field effect transistor examined was processed.

The first chips are preferably mechanically fixed on the second substrate, in particular by means of adhesive bonding or using adhesion. It is ensured in this way that the first chips fitted on the second substrate withstand a repeated treatment in a wafer prober.

If the first substrate and the second substrate have different sizes (the first substrate preferably has a larger dimensioning than the second substrate), the rearrangement of the first chips according to the invention clearly brings about an extension or compression of the image of the first chip on the first substrate onto the second substrate. If, by way of example, the Cartesian coordinates of a first chip on the first substrate are x and y, then a for example congruent mapping of said first chip onto the second substrate could have the Cartesian coordinates ax and by on the second substrate, a and b being extension factors that are preferably less than one.

To put it another way, the arrangement may consist in arranging the first chips on the second substrate in such a way that the relative positions of the first chips on the second substrate correspond to their relative positions on the first substrate, or correspond at least apart from a scaling factor.

By selectively extracting only the first chips from the first substrate and applying them to the second substrate in a corresponding arrangement, it is possible e.g. for the chips assigned to a first development partner to be arranged on the second substrate and to be made accessible for a subsequent examination (e.g. of test structures that may be formed on the first chips). Independently of the first chips, the other chips can be used simultaneously by other development partners to which these other chips are assigned, in order e.g. to examine said chips or to develop them further. By way of example, the second chips assigned to a second development partner may be arranged congruently, i.e. in accordance with the arrangement of the second chips on the first substrate, on a third substrate.

The invention enables a significantly more effective utilization of the different chips of the first substrate by associated chips clearly being arranged on other substrates (preferably congruently).

By way of example, in the case of the method according to the invention, chips of a 300 mm wafer may be sawn into sub-chips and be adhesively bonded onto separate carrier wafers having e.g. a smaller diameter (200 mm or less). In order to facilitate the alignment of the chips, depressions may be etched, for example by means of potassium hydroxide (KOH), into the carrier wafer or carrier wafers for example in accordance with a regular grid, whereby edges of the depressions form a mechanical stop when the chips are inserted as first chips into a respective carrier wafer as second substrate. Such carrier wafers or daughter wafers are cost-effective since no particular properties (in particular no particular electronic requirements) have to be presupposed for them. They can be prepared and processed by means of simple process steps that are well known from micromechanics. After a basic characterization of the test structures in the sawing lines, as is customary in the case of productive hardware, the initial wafers can be thinned by grinding and be sawn along the sawing lines provided. The chips are then transferred to the grid position assigned to them on the daughter wafers, so that their relative position is preserved.

On the daughter wafers, all test structures continue to be available for corresponding examinations which can be effected as previously on wafers having a smaller diameter. As a result, all sub-chips can be examined by the development partners temporally in parallel, independently of one another and without restrictions. Moreover, an older equipment that is not suitable for processing modern 300 mm wafers can continue to be used without any restriction. The confidentiality of test structures (i.e. of different chips) is also preserved since all that is accessible to each development partner is its own hardware in the form of the chips assigned to it on a respective daughter substrate assigned to it.

As an alternative to a transfer from a slice-type, essentially round 300 mm wafer to a slice-type, essentially round carrier wafer, the chips may also be applied to a strip-type carrier and be examined as required by means of a suitable probing equipment.

An important aspect of the invention thus consists in dividing up the delegated chips of the first substrate (e.g. a 300 mm wafer) onto unambiguously assigned positions of a second substrate (a carrier wafer having a smaller diameter) that is different from the first substrate, e.g. in order to enable a plurality of different development partners to utilize the hardware simultaneously and in order to be able to continue to utilize laboratory equipment without any restriction.

The first chips are arranged on the second substrate in unhoused fashion, so that all contacts of the first chip are available on the second substrate (for example for subsequent test measurements) without any restriction. To put it another way, the first chips can be freely contact-connected on the second substrate. An expensive housing and a cost-intensive packaging process are dispensable according to the invention.

With the use of a conventional silicon wafer as second substrate, this second substrate with the first chips mechanically fixed thereto can be examined using established test devices adapted to conventional silicon wafers.

Preferred developments of the invention emerge from the dependent claims.

Preferably, the first substrate is larger than the second substrate.

In particular, the first substrate may be a wafer (e.g. a silicon wafer) having a diameter of 300 mm, and the second substrate may be a smaller wafer (e.g. having a diameter of 200 mm or less). This size ratio of first substrate and second substrate saves costs since, after all, smaller chips than those on the first substrate have to be arranged on the second substrate and, consequently, a smaller area suffices on the second substrate. Moreover, the first chips can then also be examined by means of measuring equipment that is suitable only for examining substrates that are smaller than the first substrate.

The first substrate may be a semiconductor wafer, the first chips may be first electronic chips of the semiconductor wafer and the second chips may be second electronic chips of the semiconductor wafer.

The first substrate may be a semiconductor wafer having a diameter of 300 mm.

The second substrate may also be a semiconductor wafer, e.g. a semiconductor wafer having a diameter of less than 300 mm, preferably having a diameter of 200 mm.

As an alternative to providing the second substrate as a semiconductor wafer, the second substrate may also be provided as a strip-type carrier. An unambiguous assignment of positions of first chips on the strip-type carrier to corresponding positions on the first substrate is likewise made possible in accordance with this configuration.

At least one test structure for testing the functionality of at least one part of the first substrate may be formed on the first chips.

A first chip may contain test structures and additionally other integrated circuit components or may have only test structures, i.e. comprise test structures.

Such test regions may contain e.g. field effect transistors or other integrated components which contain process-technologically critical components (e.g. the gate insulating layer of a field effect transistor) which should be checked with regard to their quality after a fabrication process. The test structures from the first chips can be electrically driven and examined on the second substrate by the development partner to which the first chips are assigned. Consequently, it is possible to check the process implementation in the fabrication of a semiconductor product and the functionality thereof.

The first chips may be assigned to a first development entity for developing at least one part of the first substrate, and the second chips may be assigned to a second development entity (different from the first development entity) for developing at least one part of the first substrate).

Such development partners may be e.g. different companies active in different fields of technology that are jointly required for fabricating the first substrate. Such development partners, in the context of a development cooperation, may contribute different know-how and technical knowledge to develop and fabricate a semiconductor product. By virtue of the fact that, according to the invention, all that is made accessible to each development partner is the chips and thus test structures assigned to it, confidential know-how of one development partner which is not intended to be made accessible to another development partner can be kept secret. The unrestricted availability of their own (e.g. first) chips is simultaneously ensured.

In accordance with the method according to the invention, the first chips may be singulated by means of sawing the first substrate.

The first substrate may be thinned by grinding prior to sawing.

As a result of the thinning by grinding that precedes the sawing, it is possible to reduce the expenditure of time for sawing in that firstly the first substrate is preferably thinned by grinding on the rear side and then sawing lasting only for a short time with a small depth is sufficient.

Receptacle regions for receiving the first chips may be formed on the second substrate.

To put it another way, specific surface regions on the second substrate may be configured in such a way that they are suitable for receiving corresponding first chips. By way of example, the receptacle regions may be depressions having a geometrical shape into which the first chips fit exactly or with a certain tolerance. The receptacle regions may be provided e.g. in rectangular fashion and may have a larger dimensioning than rectangular first chips in the case of which one rectangle corner is distinguished to the effect that the first chips that are singulated from the first substrate can be oriented along this first rectangle corner and can be arranged e.g. at the top on the left in a rectangular receptacle region. This facilitates the congruent arrangement of the first chips on the second substrate.

In particular, a grid made of depressions as receptacle regions may be formed in the second substrate.

In accordance with this configuration, e.g. a matrix-type arrangement of the first chips on the first substrate may be mapped onto a grid-type arrangement of the first chips on the second substrate.

The depressions may be formed in the first substrate e.g. by means of etching using potassium hydroxide (caustic potash solution, KOH).

The second substrate may be coupled to an external test device for testing the first chips.

By virtue of the fact that the arrangement of the first chips on the second substrate represents an unambiguously assignable (preferably congruent) reproduction of the arrangement of the first chips on the first substrate, it is also possible to use conventional test devices for testing the test structures arranged on the first chips. For this purpose, contacts of an external test device may be coupled to contacts to test structures on the first chips. Such contacts may be formed on the top side of the chips, for example.

The unambiguous assignment of each of the first chips on the second substrate to an associated first chip on the first substrate may be realized by the first chips on the second substrate being mapped congruently with respect to the prior arrangement of the first chips on the first substrate. Expressed mathematically, the arrangement of the first chips on the second substrate may then be regarded as an extension of the arrangement of the first chips on the first substrate.

As an alternative, the unambiguous assignment of each of the first chips on the second substrate to an associated first chip on the first substrate may be realized by means of providing each of the first chips with a marking. By way of example, each of the wafers may be provided with an identification (e.g. scribing in a number or writing to the chip).

In accordance with another alternative, the unambiguous assignment of each of the first chips on the second substrate to an associated first chip on the first substrate may be realized by means of a table in which the assignment of each of the first chips on the first substrate to the associated first chip on the second substrate is stored. Such a table or database may assign an associated chip position on the second substrate to each chip position on the first substrate.

An exemplary embodiment of the invention is illustrated in the figures and is explained in more detail below.

Figure 2:
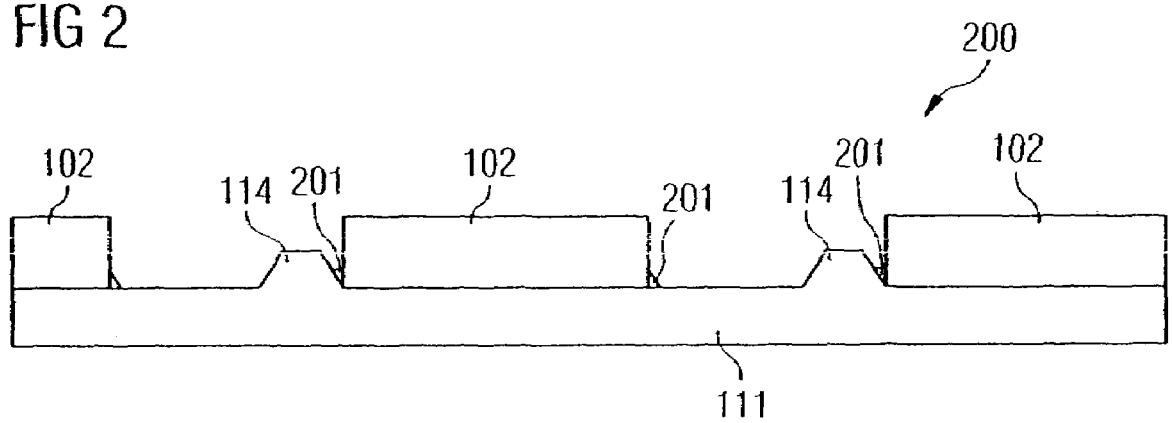

In the figures:

FIG. 1 shows a 300 mm wafer having a multiplicity of chips and 200 mm wafer, onto which a portion of the chips of the 300 mm wafer are mapped congruently, FIG. 2 shows a cross section along the 200 mm wafer from FIG. 1 along a section line A-A'.

Identical or similar components in different figures are provided with identical reference numerals.

The illustrations in the figures are schematic and not to scale.

A description is given below, referring to FIG. 1, of a method for forming a structure of sub-chips 102 on a 200 mm silicon wafer 111, which structure is congruent with respect to a 300 mm silicon wafer 100, in accordance with a preferred exemplary embodiment of the invention.

FIG. 1 shows a 300 mm silicon wafer 100 divided into a multiplicity of electronic chip groups 101. Each of the electronic chip groups 101, in each of which is formed an integrated electronic circuit, having a logic subcircuit and a memory subcircuit (not shown), is divided into nine chips 102 to 110. In FIG. 1, a first chip 102 is designated by the letter A, a second chip 103 is designated by the letter B, a third chip 104 is designated by the letter C, a fourth chip 105 is designated by the letter D, a fifth chip 106 is designated by the letter E, a sixth chip 107 is designated by the letter F, a seventh chip 108 is designated by the letter G, an eighth chip 109 is designated by a letter H and a ninth chip 110 is designated by the letter I. Each of the chips 102 to 110 is assigned to a respective development partner for forming a chip group 101 with a predetermined semiconductor-technological functionality. The first chips 102 are assigned to a development partner A, the second chips 103 are assigned to a development partner B, . . . .

In a conventional use, the 300 mm wafer 100 would be assigned in its totality, e.g. to the development partner A, which could examine test structures assigned to its development region A on the 300 mm silicon wafer 100 by examining the first chips 102. All the other chips B to I are left unused in the case of this procedure in accordance with the prior art.

According to the invention, now not only the chip groups 101 having chips 102 to 110 but all chips 102 to 110 are singulated, i.e. separated, from the 300 mm silicon wafer 100 along sawing lines 113 by means of sawing and rear-side material removal. Afterward, the respective chips are arranged on a 200 mm silicon wafer 111 in a congruent manner, corresponding to the arrangement on the 300 mm silicon wafer 100. This is shown in FIG. 1 on the basis of the first chips 102 A, which are mapped onto the 200 mm silicon wafer 111 in accordance with a mapping 112 from the 300 mm silicon wafer 100 onto assigned relative positions. In other words, the position of the first chips 102 A on the 200 mm silicon wafer 111 corresponds to the assigned positions of the respective first chip 102 on the 300 mm silicon wafer 100. To put it another way, the relative arrangement of the first chips 102 with respect to one another is preserved.

The 200 mm silicon wafer 111 is then assigned to the first development partner responsible for the development of the first chips 102 A in the context of the development of the chip group 101. The test structures (not shown in the figure) arranged on the first chips 102 for testing the partial functionality A are thus all arranged on the 200 mm silicon wafer 111 assigned to the first development partner. Consequently, with regard to the development technology of the development partner A, a confidentiality in relation to the other development partners is ensured since the first chips 102 A on the 200 mm silicon wafer 101 are not available to these other development partners.

In order to ensure the congruent arrangement of the first chips 102 A on the 200 mm silicon wafer 111, a grid 114 is formed on the 200 mm silicon wafer 111, said grid comprising rectangular cutouts in plan view on the 200 mm silicon wafer 111. This grid serves for prescribing a mechanical stop for the first chips 102 when they are fixed (e.g. firmly adhesively bonded) on the 200 mm silicon wafer 111, thereby providing the arrangement of the first chips 102 A congruently with respect to that of the first chips 102 A on the 300 mm silicon wafer 100 with higher accuracy.

Consequently, FIG. 1 illustrates the congruent transfer of the first chips 102 A from the 300 mm silicon wafer 100 onto the carrier wafer 110. The remaining chips 103 to 110 of the initial wafer 100 are fixed in the same way on other carrier wafers, i.e. the second chips 103 on a second 200 mm silicon wafer, the third chips 104 on a fourth 200 mm silicon wafer, . . . .

In other words, FIG. 1 shows, in a schematic illustration, the congruent positioning of chips 102 of a 300 mm wafer 100 onto a carrier wafer 111 having a smaller diameter.

A description is given below, referring to FIG. 2, of a cross-sectional view 200 of a region of the 200 mm silicon wafer 111 from FIG. 1 in accordance with the section line A-A'.

FIG. 2 shows the 200 mm silicon wafer 111 in cross-sectional view, the various first chips 102 being adhesively bonded on the 200 mm silicon wafer 111. The grid 114 is formed from depressions that are etched into the 200 mm silicon wafer 111 by means of KOH. The residual grid elements 114 thus form a mechanical stop when the first chips 102 A are arranged on the grid 114 and fixed by means of adhesive 201.

To put it another way, FIG. 2 shows a cross section through the carrier wafer 111 with the depressions into which the first chips 102 A have been adhesively bonded, the topology edge 114 of the carrier wafer 111 serving as a mechanical stop.

I claim:

1. A test arrangement for integrated circuits, the test arrangement comprising:
   a first substrate divided into a multiplicity of electronic chip groups each including a plurality of first and second electronic chips, the first and second electronic chips arranged to be singulated and grouped with other respective chips from the first substrate;
   a second substrate upon which the grouped first chips are arranged in a congruent manner, corresponding to the arrangement on the first substrate, for further development and testing of the grouped first chips; and
   a third substrate upon which the grouped second chips are arranged in a congruent manner, corresponding to the arrangement on the first substrate, for further development and testing of the grouped second chips.

2. The test arrangement of claim 1 wherein each of the multiplicity of electronic groups is formed an integrated electronic circuit.

3. The test arrangement of claim 1 wherein each of the grouped electronic chips is assigned to a respective development partner for forming an electronic chip group with a predetermined semiconductor-technological functionality.

4. The test arrangement of claim 1 further comprising a mapping from the first substrate onto assigned relative positions of the second substrate so that the position of the grouped electronic chips on the second substrate corresponds to the assigned positions of a respective electronic chips on the first substrate, thereby preserving the relative arrangement of the grouped electronic chips with respect to one another.

5. The test arrangement of claim 1 wherein the second substrate comprises a grid formed on the second substrate to serve as a mechanical stop for the grouped first chips when they are arranged on the second substrate.

6. The test arrangement of claim 5 wherein the grid comprises rectangular cutouts arrangement on a surface of the second substrate.

7. A test arrangement for integrated circuits, the test arrangement comprising a first substrate, a second substrate and a third substrate, the first substrate having a larger dimensioning than the second substrate, the first substrate including a multiplicity of electronic chips including a plurality of first and second chips, respectively, all the first chips being congruently mapped from the first substrate upon singulation of the multiplicity of electronic chips, the mapping of the first chips on the second substrate correspond to their relative positions on the first substrate, or correspond according to a scaling factor, and all the second chips being congruently mapped from the first substrate upon singulation of the multiplicity of electronic chips, the mapping of the second chips on the third substrate being such that relative positions of the second chips on the third substrate correspond to their relative positions on the first substrate, or correspond according to a scaling factor.

8. The test arrangement of claim 7 wherein for each first chip having Cartesian coordinates of x and y on the first substrate, then the congruent mapping of the each first chip onto the second substrate has the Cartesian coordinates ax and by on the second substrate, a and b being extension factors.

9. The test arrangement of claim 8 wherein a and b have values less than 1.

* * * * *